United States Patent
Lee

(10) Patent No.: US 9,691,996 B2
(45) Date of Patent: Jun. 27, 2017

(54) STRETCHABLE DISPLAY DEVICE AND MANUFACTURING METHOD THEREOF

(71) Applicant: SAMSUNG DISPLAY CO., LTD., Yongin-si, Gyeonggi-do (KR)

(72) Inventor: Soo Yeon Lee, Seoul (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/990,017

(22) Filed: Jan. 7, 2016

(65) Prior Publication Data

US 2016/0240802 A1    Aug. 18, 2016

(30) Foreign Application Priority Data

Feb. 17, 2015   (KR) ................. 10-2015-0024479

(51) Int. Cl.
*H01L 27/32* (2006.01)
*H01L 51/00* (2006.01)

(52) U.S. Cl.
CPC ........ *H01L 51/0097* (2013.01); *H01L 27/326* (2013.01); *H01L 27/3213* (2013.01); *H01L 27/3218* (2013.01); *H01L 27/3241* (2013.01); *H01L 27/3276* (2013.01); *H01L 2251/5338* (2013.01); *Y02E 10/549* (2013.01)

(58) Field of Classification Search
CPC ............ H01L 27/3241; H01L 27/3218; H01L 27/3213; H01L 27/326; H01L 27/3276
See application file for complete search history.

(56) References Cited

U.S. PATENT DOCUMENTS

| | | | |
|---|---|---|---|
| 2014/0138637 A1 | 5/2014 | Yang et al. | |
| 2014/0232956 A1* | 8/2014 | Kwon | G02F 1/133305 349/12 |

FOREIGN PATENT DOCUMENTS

| | | |
|---|---|---|
| JP | 2003-094620 A | 4/2003 |
| KR | 10-2014-0060822 A | 5/2014 |

* cited by examiner

*Primary Examiner* — Douglas Menz
(74) *Attorney, Agent, or Firm* — Lee & Morse, P.C.

(57) ABSTRACT

A stretchable display device includes a stretchable substrate capable of being expanded or contracted in a first direction and pixel portions on the stretchable substrate. The pixel portions include rigid areas provided with a light emitter to selectively emit light depending on a driving signal and elastic areas surrounding the rigid areas. The pixel portions are continuously adjacent to each other in the first direction to form a plurality of pixel lines. The pixel portions included in a first pixel line and a second pixel line that are adjacent in the second direction are arranged in a zigzag form along the first direction.

23 Claims, 17 Drawing Sheets ary skill
STRETCHABLE DISPLAY DEVICE AND MANUFACTURING METHOD THEREOF

CROSS-REFERENCE TO RELATED APPLICATION

Korean Patent Application No. 10-2015-0024479, filed on Feb. 17, 2015, in the Korean Intellectual Property Office, and entitled: "Stretchable Display Device and Manufacturing Method Thereof," is incorporated by reference herein in its entirety.

BACKGROUND

1. Field

The described technology relates generally to a stretchable display device capable of being expanded or contracted by external force, and a manufacturing method thereof.

2. Description of the Related Art

An organic light emitting diode display is a self-luminous display device displaying images using an organic light emitting element (e.g., an organic light emitting diode) that emits light. Since the organic light emitting diode display does not require a separate light source, unlike a liquid crystal display device, thickness and weight of the entire display device may be reduced. Further, since the organic light emitting diode display has high grade characteristics, e.g., low power consumption, high luminance, and a high response speed, the organic light emitting diode display receives attention as a next generation display device for portable electronic devices.

Recently, the organic light emitting diode display has been developed as a flexible display device and a stretchable display device by using a substrate made of a flexible or elastic material, e.g., plastic or foil, which can easily accomplish a large-area, thin, and lightweight display.

In the stretchable display device, intervals between elements on the substrate change depending on how the substrate is stretched. Thus, directional deviation of display resolution thereof may occur depending on a direction of the stretch. For example, when the stretchable display device is expanded in a lateral or longitudinal direction, a display resolution in one of the lateral and longitudinal directions decreases, such that image representation may deteriorate.

The above information disclosed in this Background section is only for enhancement of understanding of the background of the described technology and therefore it may contain information that does not form the prior art that is already known in this country to a person of ordinary skill in the art.

SUMMARY

One or more embodiments is directed to a stretchable display device, including a stretchable substrate to be expanded or contracted along a first direction and pixel portions on the stretchable substrate, each pixel portion including a rigid area, a light emitter to selectively emit light depending on a driving signal on the rigid area, and an elastic area surrounding the rigid area and being stretchable in the first direction. A plurality of the pixel portions may be continuously adjacent to each other in the first direction to form a plurality of pixel lines. The pixel portions included in a first pixel line and a second pixel line that are adjacent in a second direction crossing the first direction, may be arranged in a zigzag form along the first direction in an initial state.

The first pixel line may be an n-th pixel row and the second pixel line may be an n+1-th pixel row.

An interval between the center of the pixel portions of the n-th pixel row and the center of the pixel portions of the n+1-th pixel row in the first direction may be half of that between the centers of adjacent pixel portions of the n-th pixel row in the first direction.

The pixel portions in the n+1-th pixel row may be disposed to be moved by a half interval of a maximum width of the n+1-th pixel portion in the first direction from respective pixel portions included in the n-th pixel row in the first direction.

The stretchable substrate may include a stretchable pattern layer having a serpentine pattern.

The serpentine pattern may extend in the first direction while moving back and forth in the second direction.

An area of the stretchable substrate corresponding to the elastic area of the pixel portion may be made of an elastic material.

The stretchable substrate may be made of a polydimethylsiloxane (PDMS) material.

The stretchable display device may further include a first wire that extends in the first direction while being around boundaries of the rigid areas of the pixel portions.

The first wire may alternately wind along the rigid areas of the pixel portions of the first pixel line and the rigid areas of the pixel portions of the second pixel line.

The stretchable display device may further include a second wire that extends in the second direction while being around along boundaries of the rigid areas of the pixel portions.

The rigid area of each pixel portion may have a circular planar shape.

The rigid area may be made of a rigid material.

The elastic area may be made of an elastic material.

The pixel portion may include a thin film transistor in the rigid area, a first wire that extends in the first direction and is connected to a gate electrode of the thin film transistor, and a second wire that extends in the second direction and is connected to a source electrode of the thin film transistor.

The pixel portion may have a rhomboidal planar shape.

The first pixel line is an n-th pixel row, the second pixel line is an n+1-th pixel row, and the pixel portions included in the n+1-th pixel row are respectively disposed to be moved by half of a diagonal length of the n+1-th pixel portion in the first direction from respective pixel portions included in the n-th pixel row.

The pixel portion may have a hexagonal planar shape.

The pixel portion may include light emitters that respectively emit red, green, and blue light.

Respective subpixels have a rectangular planar shape and are adjacent to each other in the first direction.

The subpixel may include light emitters that respectively emit red, green, blue, and white light.

The subpixel may divide the light emitter in four portions.

The first pixel line may be an m-th pixel column and the second pixel line may be an m+1-th pixel column.

One or more embodiments is directed to a method of manufacturing a stretchable display device, the method including preparing a stretchable substrate, forming rigid areas on the stretchable substrate, forming a first wire extending in a first direction and around boundaries of the rigid areas, and forming a second wire extending in a second direction crossing the first direction on the rigid areas.

Preparing the stretchable substrate may include forming the stretchable pattern layer to have a serpentine pattern extending in the first direction while moving back and forth in the second direction on the stretchable substrate.

Preparing the stretchable substrate may include patterning the stretchable pattern layer by molding.

BRIEF DESCRIPTION OF THE DRAWINGS

Features will become apparent to those of skill in the art by describing in detail exemplary embodiments with reference to the attached drawings in which:

FIGS. 4A to 4C illustrate top plan views of pixel arrangement configurations of a stretchable display device according to an exemplary embodiment, wherein FIG. 4A illustrates a pixel arrangement configuration before the stretchable display device is expanded, FIG. 4B illustrates a pixel arrangement configuration while the stretchable display device is being expanded, and FIG. 4C illustrates a pixel arrangement configuration after the stretchable display device is expanded.

FIGS. 5A and 5B illustrate top plan views of pixel and wire configurations of a stretchable display device according to an exemplary embodiment, wherein FIG. 5A illustrates a pixel and wire configuration before the stretchable display device is expanded, and FIG. 5B illustrates a pixel and wire configuration after the stretchable display device is expanded.

FIGS. 9A and 9B illustrate top plan views of pixel and wire configurations of a stretchable display device according to a further exemplary embodiment, wherein FIG. 9A illustrates a pixel and wire configuration before the stretchable display device is expanded, and FIG. 9B illustrates a pixel and wire configuration after the stretchable display device is expanded.

FIGS. 10A to 10C illustrate top plan views of pixel arrangement configurations of a stretchable display device according to another exemplary embodiment, wherein FIG. 10A illustrates a pixel arrangement configuration before the stretchable display device is expanded, FIG. 10B illustrates a pixel arrangement configuration while the stretchable display device is being expanded, and FIG. 10C illustrates a pixel arrangement configuration after the stretchable display device is expanded.

DETAILED DESCRIPTION

Figure 1:
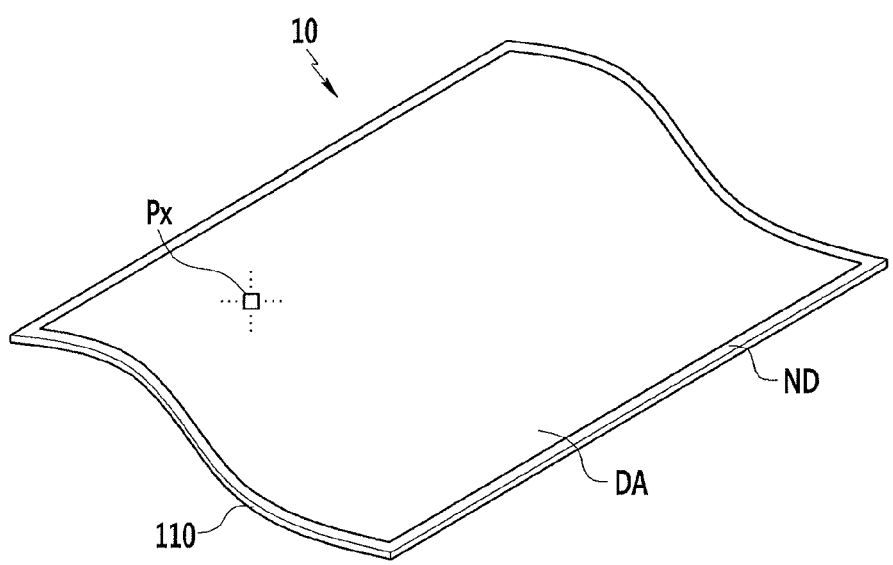
FIG. 1 illustrates a schematic perspective view of a stretchable display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. Like reference numerals refer to like elements throughout.

In addition, throughout the specification, "on" implies being positioned above or below a target element and does not imply being necessarily positioned on the top on the basis of a gravity direction. In addition, unless explicitly described to the contrary, the word "comprise" and variations such as "comprises" or "comprising" will be understood to imply the inclusion of stated elements but not the exclusion of any other elements.

Stretchable display device according to exemplary embodiments will now be described in detail with reference to the accompanying drawings.

Figure 2:
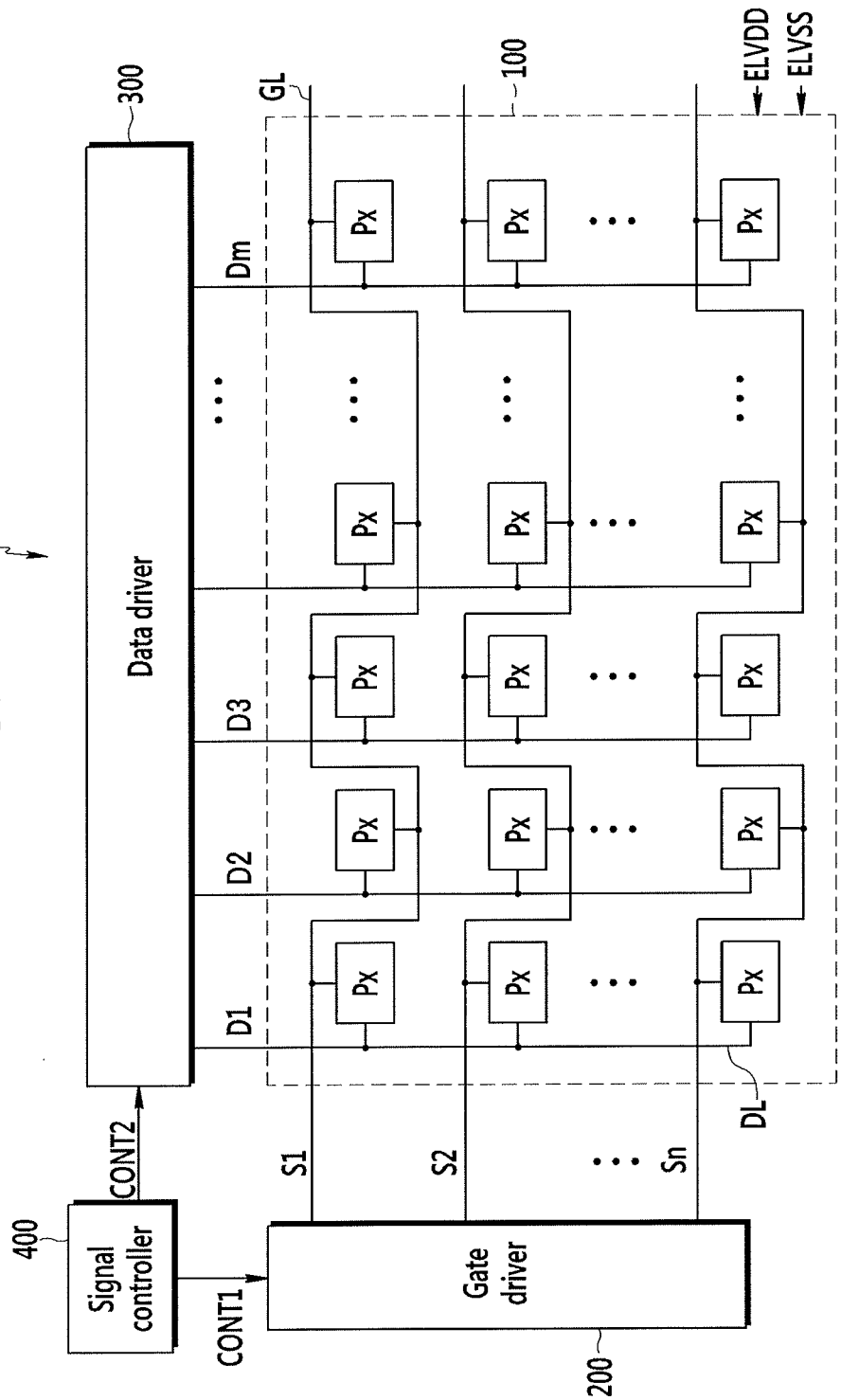
FIG. 2 illustrates a block diagram schematically of a configuration of pixels and wires of a stretchable display device according to an exemplary embodiment.

FIG. 1 is a schematic perspective view of a stretchable display device according to an exemplary embodiment. FIG. 2 is a block diagram schematically illustrating a configuration of pixels and wires of a stretchable display device according to an exemplary embodiment.

Referring to FIG. 1, a stretchable display device 10 according to the present exemplary embodiment includes a display area DA and a non-display area ND formed on a stretchable substrate 110 capable of being expanded or contracted, pixel portions Px may be formed in the display area DA, and a driver driving the pixel portions Px may be disposed in the non-display area ND. The pixel portions Px may be connected with the driver by wires formed throughout the display area DA and the non-display area ND, and may display images based on driving signals transmitted from the driver.

Since the stretchable substrate 110 is expanded in at least one direction by external force, and is returned to its original state when the external force is removed, the stretchable substrate 110 may be made of an elastic material. The stretchable substrate 110 may be expanded in one direction or in two crossing directions, such that the display area DA may be expanded depending on extension of the stretchable substrate 110.

Referring to FIG. 2, the stretchable display device 10 according to the present exemplary embodiment includes a display unit 100, a gate driver 200, a data driver 300, and a signal controller 400. The display unit 100 includes the display area DA including a plurality of pixel portions Px, a plurality of gate wires transmitting a plurality of gate signals (S1-Sn), a plurality of data wires transmitting a plurality of data signals (D1-Dm), and a plurality of wires applying a first driving voltage (ELVDD) and a second driving voltage (ELVSS).

Each of the pixel portions Px is connected to a gate wire and a data wire corresponding to the pixel portion Px, a wire for the first driving voltage (ELVDD), and a wire for the second driving voltage (ELVSS). Further, each of the pixel portions Px may include a red light emitting subpixel, a green light emitting subpixel, and a blue light emitting subpixel, but other configurations for realizing white light may be employed.

The gate driver 200 generates a plurality of scanning signals (S1-Sn) depending on a first driving control signal CONT1, and transmits the scanning signal (S1-Sn) to a corresponding gate wire. The data driver 300 generates a plurality of data signals (D1-Dm), and transmits the generated data signals (D1-Dm) to a plurality of corresponding data wires depending on a second driving control signal CONT2.

Figure 3:
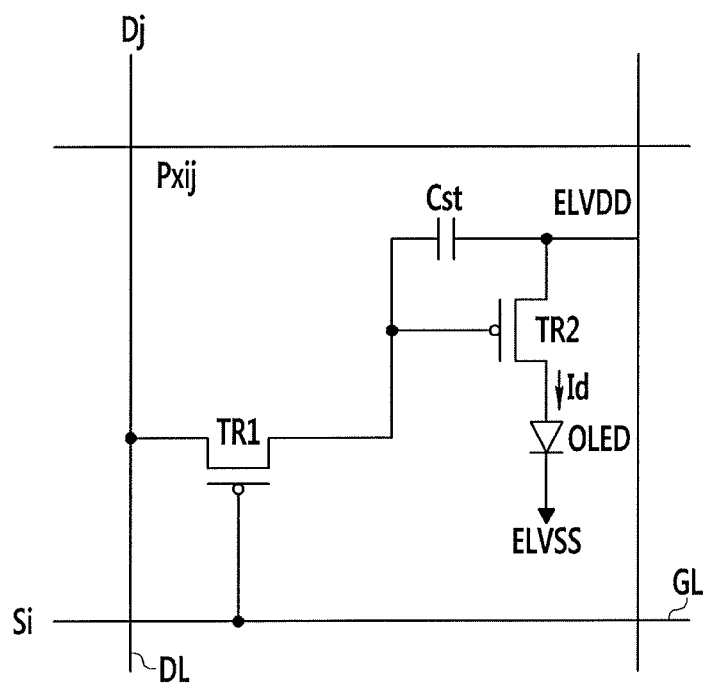
FIG. 3 illustrates a pixel equivalent circuit diagram of a stretchable display device according to an exemplary embodiment.

FIG. 3 is a pixel equivalent circuit diagram of a stretchable display device according to an exemplary embodiment. Referring to FIG. 3, in the present exemplary embodiment, a pixel portion Pxij connected to a gate wire GL transmitting an i-th scanning signal Si and a j-th data wire DL transmitting a j-th data signal Dj includes a switching transistor TR1, a driving transistor TR2, a capacitor Cst, and an organic light emitting diode (OLED).

The switching transistor TR1 includes a gate electrode connected to the i-th gate wire GL, a source electrode connected to the j-th data wire DL, and a drain electrode connected to the gate electrode of the driving transistor TR2.

The driving transistor TR2 includes a source electrode connected to the wire to which the first driving voltage ELVDD is applied, a drain electrode connected to the anode of the organic light emitting diode, and a gate electrode transmitting a voltage corresponding to the j-th data signal Dj while the switching transistor TR1 is being turned on.

The capacitor Cst is connected between the gate electrode and the source electrode of the driving transistor TR2. The OLED includes an anode connected to the drain electrode of the driving thin film transistor TR2, a cathode connected to the wire to which the second driving voltage ELVSS is applied, and an emission layer between the anode and the cathode.

In the above-configured pixel Pxij, when the switching transistor TR1 is turned on by the scan signal Si, the data voltage Dj is transmitted to the gate electrode of the driving transistor TR2. A voltage difference between the gate electrode and the source electrode of the driving transistor TR2 is maintained by the capacitor Cst, and a driving current Id flows to the driving transistor TR2. Brightness of the OLED is varied depending on the driving current Id of the driving thin film transistor TR2.

The configuration of the pixel of display device 10 according to the exemplary embodiment is not limited to the aforementioned example, and an additional thin film transistor and an additional capacitor may be further included as necessary.

Figure 4A:
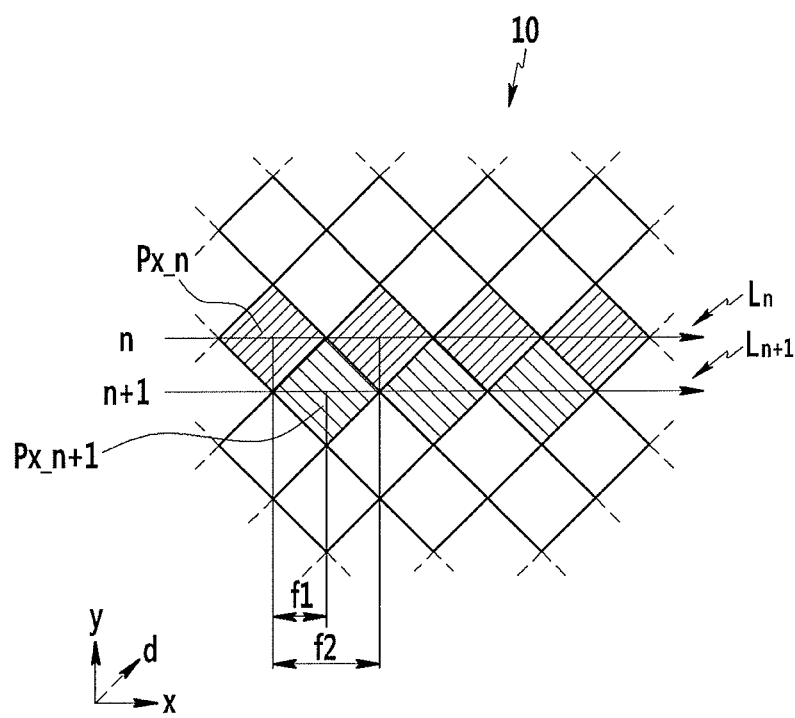
Figure 4B:
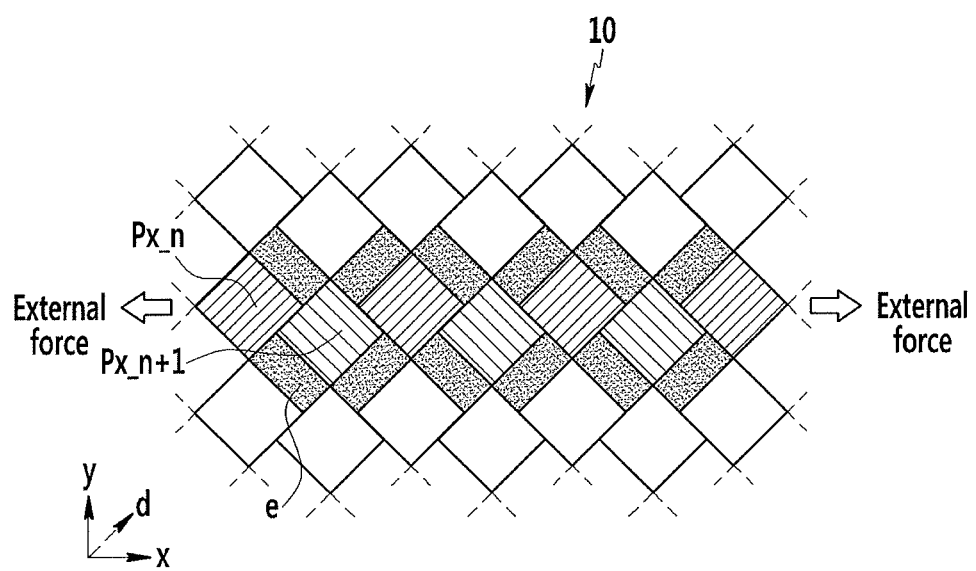
Figure 4C:
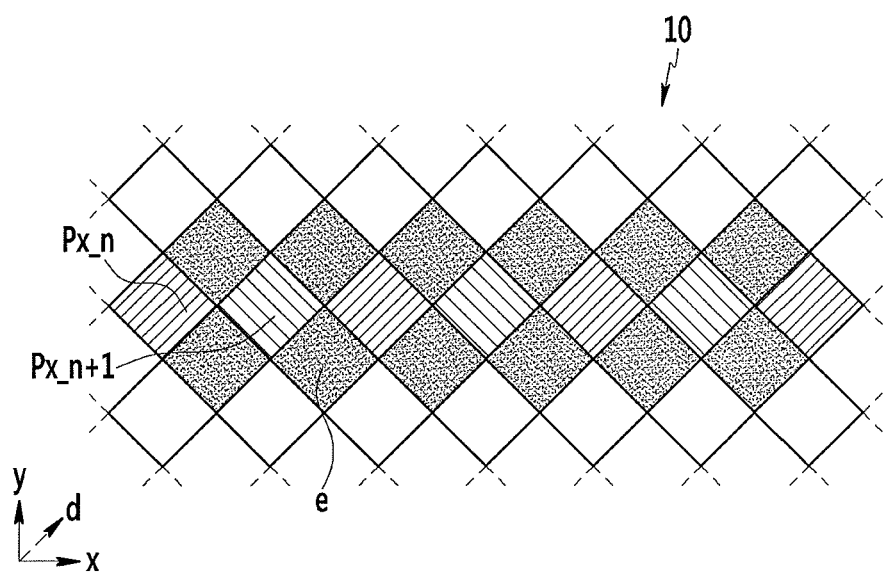

FIGS. 4A to 4C are top plan views of pixel arrangement configurations of a stretchable display device according to an exemplary embodiment. In particular, FIG. 4A illustrates a pixel arrangement configuration before the stretchable display device is expanded, FIG. 4B illustrates a pixel arrangement configuration while the stretchable display device is being expanded, and FIG. 4C illustrates a pixel arrangement configuration after the stretchable display device is fully expanded.

The stretchable display device 10 according to the present exemplary embodiment includes the pixel portions Px (see FIG. 1) formed on the stretchable substrate 110. A plurality of pixel rows in which a plurality of pixel portions Px are continuously adjacent to each other in a first direction (x-axis direction shown in FIGS. 4A to 4C) are arranged in a second direction (y-axis direction shown in FIGS. 4A to 4C) crossing the first direction. In addition, pixel portions (Px_n) and (Px_n+1) respectively included in an n-th pixel row ($L_n$) and an n+1-th pixel row ($L_{n+1}$) that are adjacent in the second direction are arranged in a zigzag form along the first direction.

An interval (f1) between the centers of the pixel portions (Px_n) and (Px_n+1) included respectively in the n-th pixel row ($L_n$) and the n+1-th pixel row ($L_{n+1}$) may be half of an interval (f2) between the centers of adjacent pixel portions (Px_n) of the n-th pixel row ($L_n$). Accordingly, in a state before being expanded, i.e., an initial or neutral state, the pixel portions (Px_n+1) included in the n+1-th pixel row ($L_{n+1}$) are respectively shifted by half of an interval of the maximum width of the n+1-th pixel portion in the first direction from respective pixel portions (Px_n) included in the n-th pixel row ($L_n$) in the first direction.

Referring to FIG. 4A, each of the pixel portions (Px_n) and (Px_n+1) is formed to have a rhomboidal planar shape in a state before being expanded, the rhomboidal pixel portions (Px_n) and (Px_n+1) are arranged to share sides thereof together with the adjacent pixel portions (Px_n) and (Px_n+1) in a diagonal direction (d) of a panel of the display device 10, and the pixel portions (Px_n) and (Px_n+1) respectively included in the pixel rows ($L_n$ and $L_{n+1}$) are arranged for edges thereof to be in contact with each other. As used herein, rhomboidal is to include a rhombus, i.e., a parallelogram with equal sides, and a rhomboid, i.e., a parallelogram with unequal adjacent sides.

The pixel portion (Px_n) included in the n-th pixel row ($L_n$) are continuously arranged for edges thereof to contact each other along the first direction, and the pixel portions (Px_n+1) included in the n+1-th pixel row ($L_{n+1}$) are continuously arranged to the pixel portion (Px_n) included in the n-th pixel row ($L_n$) are continuously arranged to contact with each other sharing the sides thereof with the pixel portions (Px_n) and (Px_n+1). Accordingly, the pixel portions (Px_n+1) included in the n+1-th pixel row ($L_{n+1}$) are respectively disposed to be moved by half of a diagonal length of the pixel portion (Px_n+1) in the first direction from respective pixel portions (Px_n) included in the n-th pixel row ($L_n$).

In the present exemplary embodiment, each of the pixel portions (Px_n) and (Px_n+1) include emission areas that selectively emit depending on a driving signal, and elastic areas surrounding the emission area and being stretchable. Accordingly, when an external force is applied to the stretchable substrate 110 at which the pixel portions (Px_n) and (Px_n+1) are formed such that the stretchable substrate 110 is expanded, the elastic areas of the pixel portions (Px_n) and (Px_n+1) is expanded, and thus the display area DA (see FIG. 1) of the stretchable display device 10 may be expanded. The emission area and elastic areas (e) of the pixel portions (Px_n) and (Px_n+1) will be described later with reference to other drawings.

Referring to FIG. 4B, when the stretchable display device 10 is expanded to the left and right along the first direction by an external force, the elastic areas (e) of the pixel portions (Px_n) and (Px_n+1) are expanded, and arrangement of the pixel portions (Px_n) and (Px_n+1) is changed. That is, an interval between the pixel portions (Px_n) of the n-th pixel row ($L_n$) become larger in the first direction, and the pixel portions (Px_n+1) of the n+1-th pixel row ($L_{n+1}$) are respectively moved along the sides of respective pixel portions (Px_n) and (Px_n+1) in a diagonal direction (d) of the panel to be between the pixel portions (Px_n) of the n-th pixel row ($L_n$).

Accordingly, referring to FIG. 4C, when the stretchable display device 10 is laterally expanded to the utmost along the first direction, the pixel portion (Px_n) of the n-th pixel row ($L_n$) and the pixel portion (Px_n+1) of the n+1-th pixel row ($L_{n+1}$) cross along the first direction, and are arranged in a same row while their edges contact with each other. In this case, expansion areas (e) may be formed so that the pixel portions (Px_n) and (Px_n+1) are spaced apart from each other by an area corresponding to one pixel portion in the diagonal direction (d) of the panel.

As such, by the external force, the stretchable display device 10 is fully laterally expanded such that the arrangement of the pixel portions is changed, i.e., the pixel portions (Px_n) of the n-th pixel row ($L_n$) and the pixel portions (Px_n+1) of the n+1-th pixel row ($L_{n+1}$) in the initial state are arranged in a same row and contacting each other. Thus, an interval between the pixel portions adjacent in a lateral direction (the first direction) may be equally maintained before expansion and after the stretchable display device is fully expanded. Accordingly, compared with a display device in which an interval between adjacent pixels increases when the display device is laterally stretched, the stretchable display device according to the present exemplary embodiment may prevent display resolution in an extension direction from deteriorating and improve image representation.

Figure 5A:
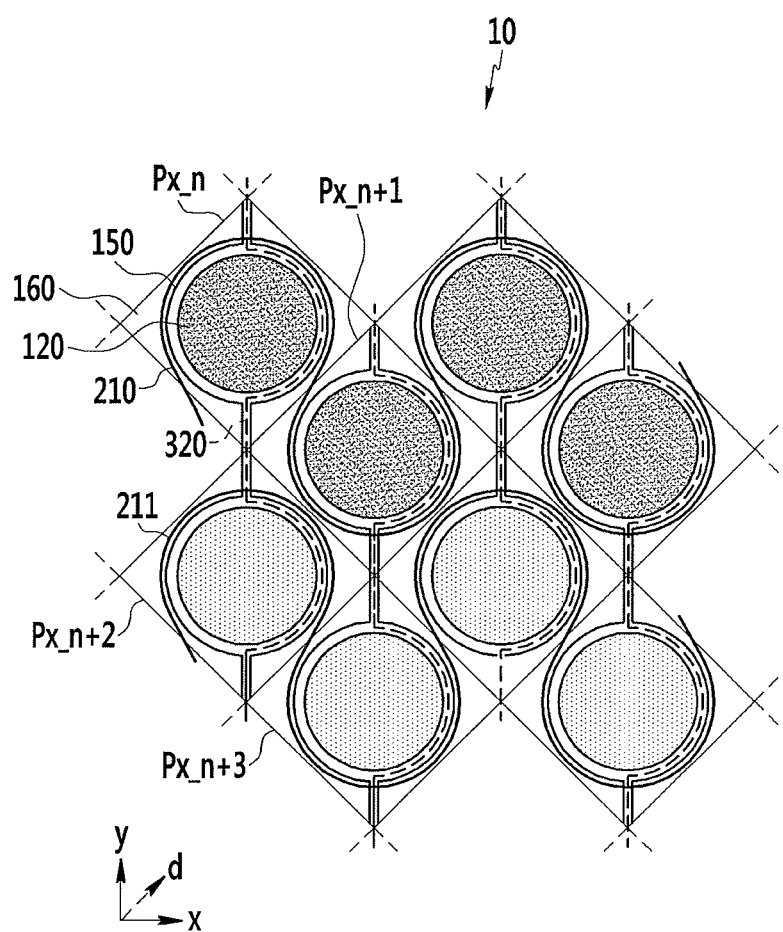
Figure 5B:
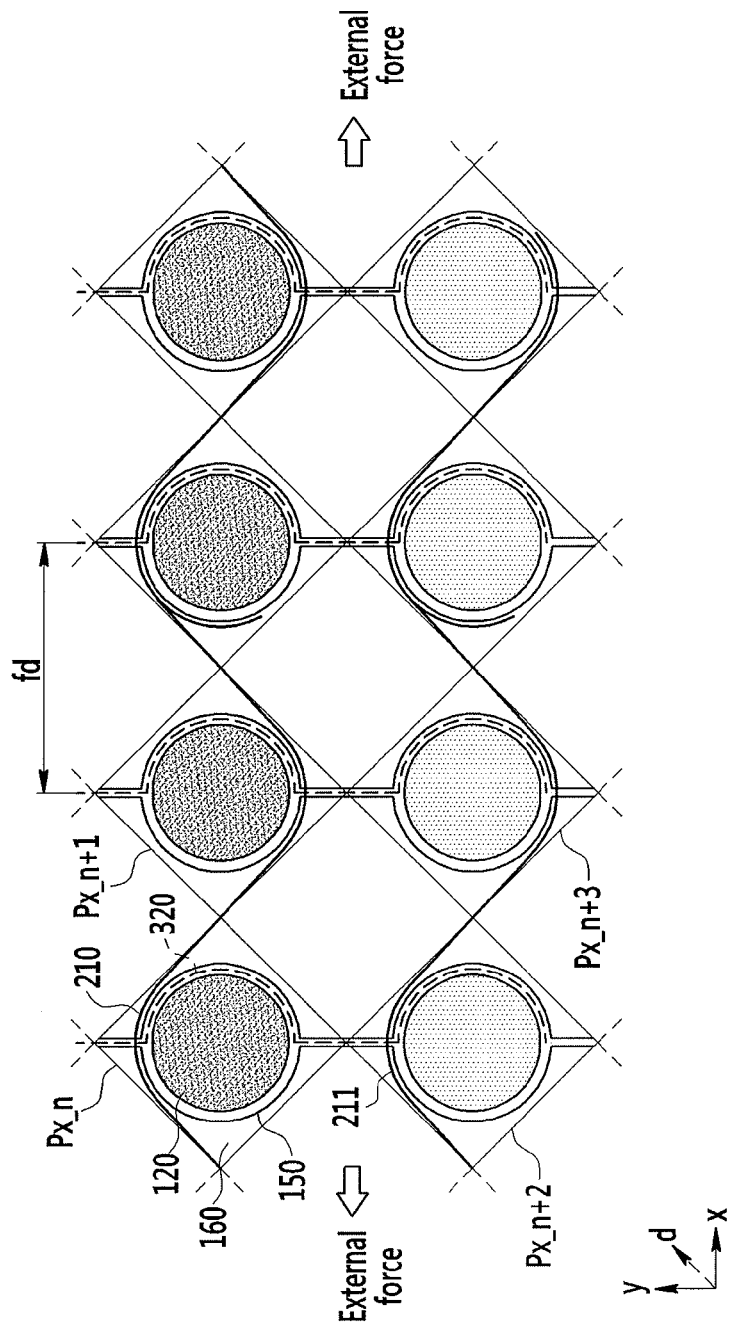

FIGS. 5A and 5B are top plan views of pixel and wire configurations of a stretchable display device according to an exemplary embodiment. In particular, FIG. 5A illustrates a pixel and wire configuration before the stretchable display device is expanded, and FIG. 5B illustrates a pixel and wire configuration after the stretchable display device is expanded.

Referring to FIG. 5A, each of pixel portions (Px_n) and (Px_n+1) of a stretchable display device 10 according to the present exemplary embodiment includes rigid areas 150 provided with a light emitter 120 to selectively emit depending on a driving signal, and elastic areas 160 surrounding the rigid area and being stretchable. Further, the stretchable display device 10 includes a first wire 210 around a portion of a periphery of the pixel portions (Px_n) and (Px_n+1) and elongated in a first direction (x-axis direction shown in FIG. 5A), and a second wire 320 around a portion of the periphery of the light emitter and elongated in a second direction (y-axis direction shown FIG. 5A). In particular, the first wire 210 may be around pixels in adjacent rows, i.e., two rows, in a serpentine or alternating fashion, while the second wire may be around light emitters 120 in a same column. The first wire 210 and the second wire 320 are formed to be elongated in directions crossing each other, but are not limited thereto, and may be respectively formed at different layers.

The rigid areas 150 are respectively disposed to include areas including the centers of the pixel portions (Px_n) and (Px_n+1), and have a circular planar shape, emission areas may be respectively ensured to the maximum in the pixel portions (Px_n) and (Px_n+1) having a rhomboidal planar shape, i.e., the rigid areas 150 combined with the elastic areas 160. Further, the rigid areas 150 are made of a rigid material, e.g., a nonelastic material, and may be made of a material applied to a conventional display device. Accordingly, although the stretchable substrate 110 is expanded by external force, the rigid areas 150 are not modified and are maintained in an original shape and an original area.

The elastic areas 160 are respectively disposed to surround the rigid areas 150 in the pixel portions (Px_n) and (Px_n+1), thus the elastic areas 160 form boundaries between the pixel portions (Px_n) and (Px_n+1). The elastic areas 160 are made of an elastic material, e.g., polydimethylsiloxane (PDMS), an elastomer, and the like.

The first wire 210 is in the elastic areas 160 of the pixel portions (Px_n) and (Px_n+1), and is elongated in the first direction while being wound along boundaries of the rigid areas 150, while moving back and forth in the second direction, i.e., between adjacent rows. That is, as shown in FIG. 5A, the first wire 210 extends along the first direction while alternately winding around, i.e., along a portion of a periphery of, the rigid areas 150 of the pixel portions of the n-th pixel row ($L_n$) and the rigid areas 150 of the pixel portions of the n+1-th pixel row ($L_{n+1}$), e.g., in a serpentine fashion. The second wire 320 is in the rigid areas 150 of the pixel portions (Px_n) and (Px_n+1), and extends in the second direction while being wound along boundaries, i.e., a portion of the periphery, of the light emitters 120. The second wire 320 extends along each pixel column.

The first wire 210 may be a gate wire GL (see FIGS. 2 and 3) connected to the gate electrode of the switching transistor TR1 of each of the pixel portions (Px_n) and (Px_n+1) to transmit a scanning signal, and the second wire 320 may be a data wire DL (see FIGS. 2 and 3) connected to the source electrode of the switching transistor TR1 of each of the pixel portions (Px_n) and (Px_n+1) to transmit a data signal.

Referring to FIG. 5B, after the stretchable display device 10 is fully expanded, an interval between the center of the pixel portion (Px_n) included in the n-th pixel row ($L_n$) and the center of the pixel portion (Px_n+1) included in the n+1-th pixel row ($L_{n+1}$) may be shifted in the first direction by the maximum width of the pixel portion (Px_n) or (Px_n+1) in the first direction, i.e., now form a single row. Since the pixel portions (Px_n) and (Px_n+1) have a rhomboidal planar shape, the pixel portions (Px_n) and (Px_n+1) are spaced apart from each other by the diagonal length (fd) of the pixel portion.

After the stretchable display device 10 is expanded, the first wire 210 is elongated, like the expanded state of the stretchable substrate 110, in the first direction from a serpentine-shaped state before being elongated. In this case, the first wire 210 is further elongated along the first direction in the expanded state or may be formed to be folded or unfolded by a serpentine pattern.

Since the first wire 210 extends in the first direction while connecting the pixel portions (Px_n) included in the n-th pixel row ($L_n$) and the pixel portions (Px_n+1) included in the n+1-th pixel row ($L_{n+1}$) to each other, the first wire 210 may serve to bind together the pixel portions (Px_n) and (Px_n+1) even in the elongated state. Similarly, since another first wire 211 extends while connecting pixel portions (Px_n+2) included in an n+2-th pixel row and pixel portion (Px_n+3) included in an n+3-th pixel row to each other, the another first wire 211 may serve to bind together the pixel portions (Px_n+2) and (Px_n+3) in the expanded state. Accordingly, when being expanded, extension in boundaries between the pixel portions (Px_n) and the pixel portions (Px_n+1) may be smaller than that in boundaries between the pixel portions (Px_n+1) and the pixel portions (Px_n+2), and the extending direction may be guided in the diagonal direction (d).

The first wires 210 and 211 and the second wire 320 are made of an elastic material capable of being expanded or contracted themselves. Thus, they may be stretchable with stretching of other elements of the display device, which is included within the scope of the disclosure.

FIGS. 6A to 6D are top plan views for illustrating stages in a method of manufacturing a stretchable display device according to an exemplary embodiment.

First, a stretchable substrate 110 provided with a stretchable pattern layer 112 is prepared.

Figure 6A:
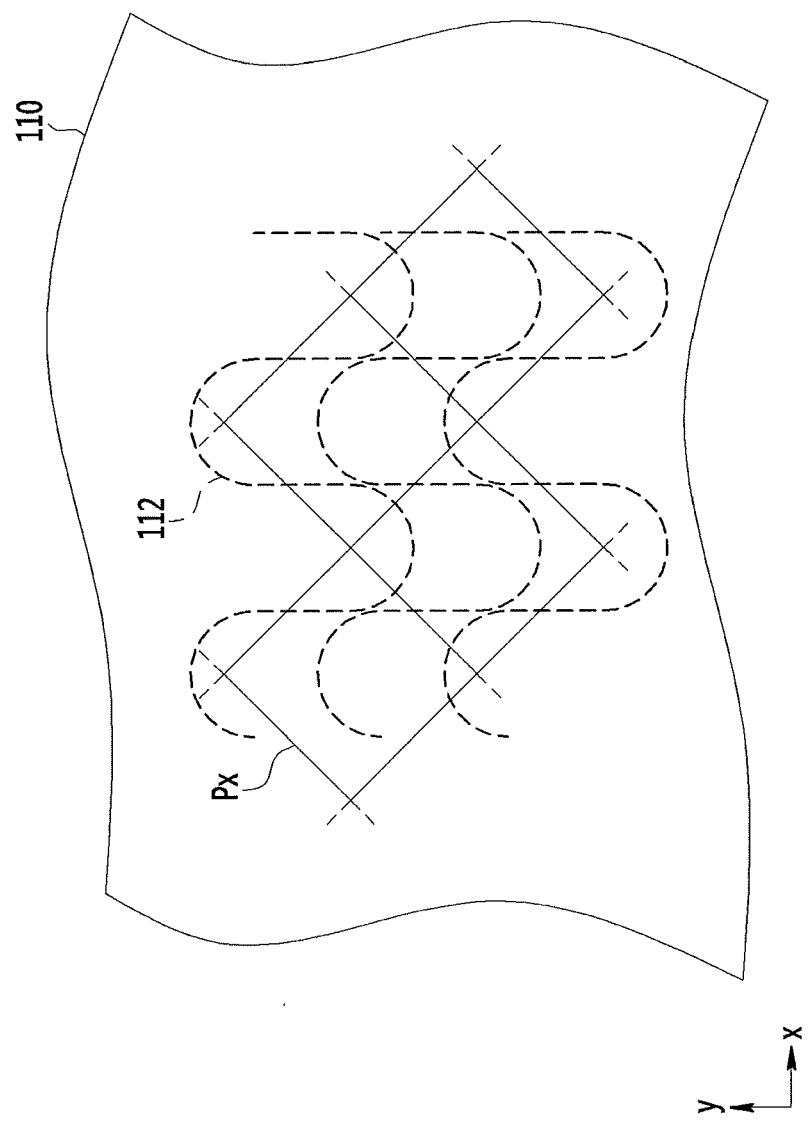
FIGS. 6A to 6D illustrate top plan views of stages in a method of manufacturing a stretchable display device according to an exemplary embodiment.

Referring to FIG. 6A, the stretchable pattern layer 112 has a serpentine pattern that moves back and forth in a second direction (y-axis direction shown in FIG. 6A) on the stretchable substrate 110 and that extends in a first direction (x-axis direction shown in FIG. 6A). The stretchable pattern layer 112 may contract in a direction crossing an extension direction thereof when the stretchable substrate 110 is expanded to the left and right by an external force. When the stretchable substrate 110 is made of a polydimethylsiloxane (PDMS) or an elastomer material, the stretchable pattern layer 112 may be patterned by molding.

When the stretchable display device 10 according to the present exemplary embodiment is expanded by an external force, as described above, the stretchable pattern layer 112 may serve to match movement of the pixel portions Px and elongation of the first wire (gate wire). Accordingly, a pattern of the stretchable pattern layer 112 may have the same cycle as that of arranging of the pixel portions Px and bending of the first wire 210.

Figure 6B:
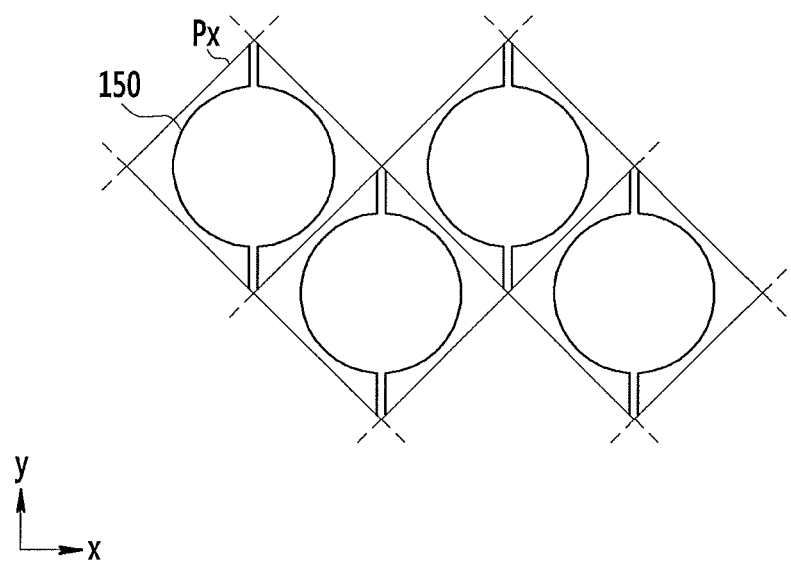

Next, as shown in FIG. 6B, rigid areas 150 are formed on the stretchable substrate 110. The rigid areas 150 are areas that are not modified and are maintained in an original shape and an original area even when the stretchable substrate 110 is expanded. For example, the rigid areas 150 may be formed by a method of optical treatment such as partial ultraviolet ray irradiation using a mask. A thin film transistor, a light emitter, a second wire (data wire), and the like may be formed on the rigid areas 150, and when the light emitter has a circular planar shape, the rigid areas 150 may be formed to have a circular planar shape. Accordingly, an area of the stretchable substrate 110 surrounding the rigid areas 150 may be made of an elastic material and serve as elastic areas 160.

Figure 6C:
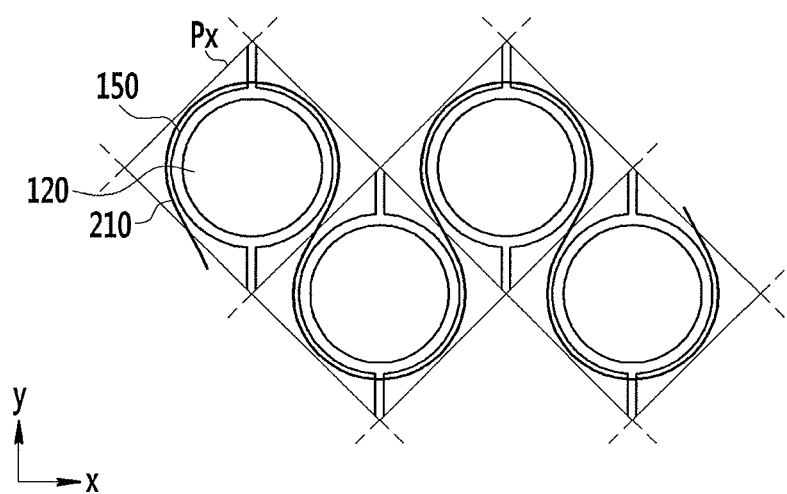

Next, as shown in FIG. 6C, a first wire 210 is deposited at circumferences of the rigid areas 150. The first wire 210 may be a gate wire, and elongates in the first direction while being wound along boundaries of the rigid areas 150 of the pixel portions Px, and elongates while moving back and forth in the second direction. That is, the first wire 210 elongates while alternately winding the rigid areas 150 of the pixel portions of the n-th pixel row and the rigid areas 150 of the pixel portions of the n+1-th pixel row. In this case, the first wire 210 may be made of an elastic material that is stretchable in an elongation direction, and may be formed to be folded or unfolded by the serpentine pattern.

Figure 6D:
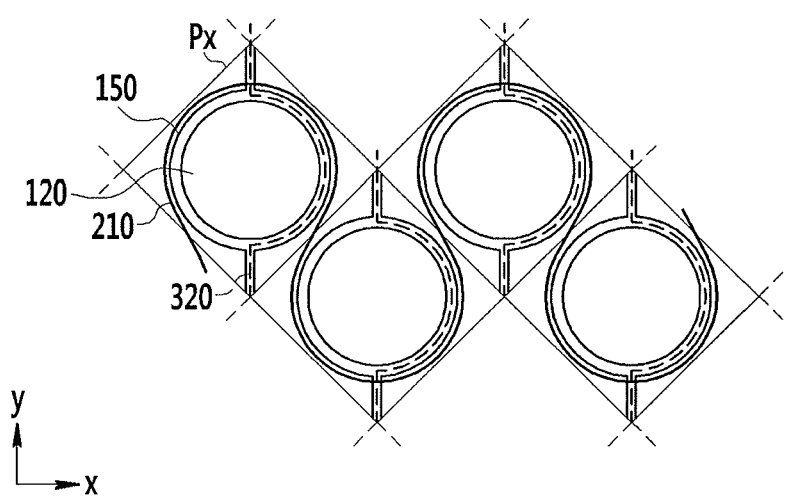

Next, as shown in FIG. 6D, light emitters 120 are respectively formed on the rigid areas 150 and the second wire 320 is formed thereon. The light emitter 120 may be made by forming a thin film transistor, an electrode, and an emission layer on the rigid area according to a typical process that is well-known to those skilled in the art.

The second wire 320 may be a data wire, and may be formed to elongate in the second direction while being wound along boundaries of the light emitters 120 of the pixel portions Px. The second wire 320 is formed to correspond to each pixel column of the stretchable display device.

Figure 7:
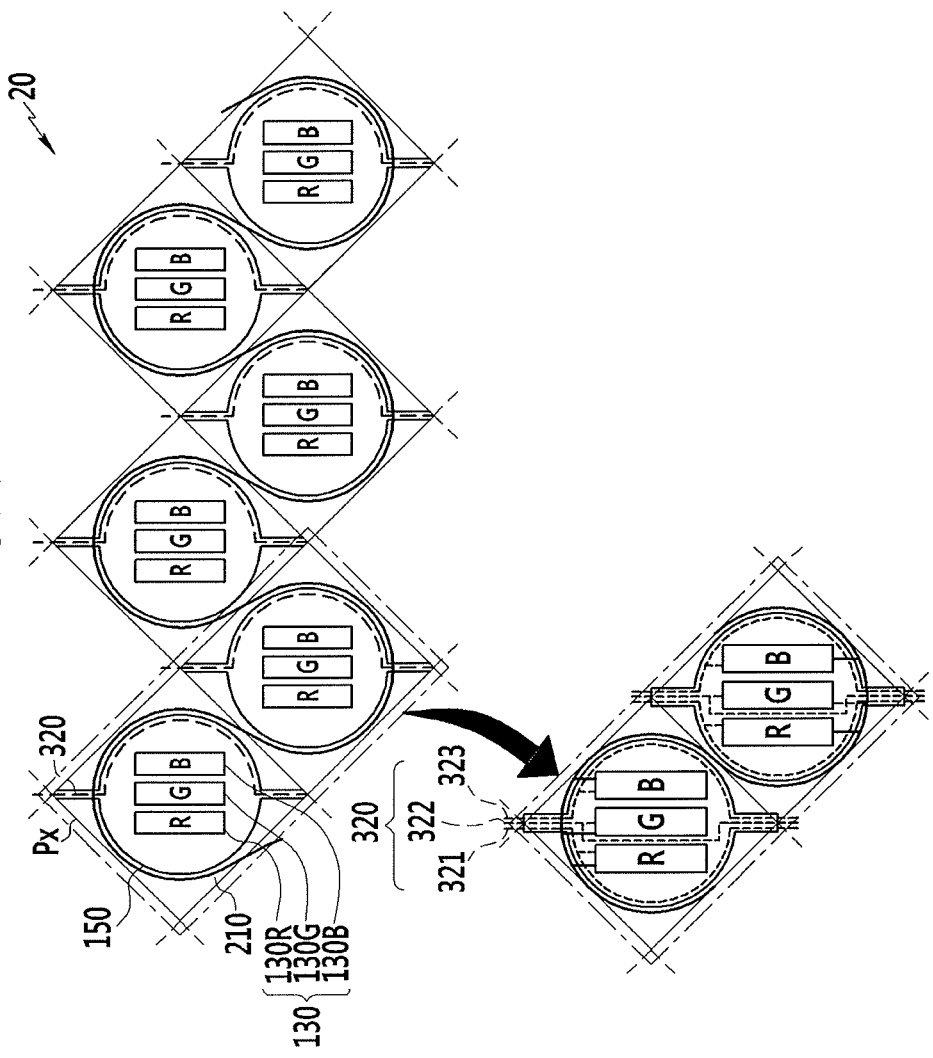
FIG. 7 illustrates a pixel layout view of a subpixel arrangement configuration and a wire connection state of a stretchable display device according to an exemplary embodiment.

FIG. 7 is a pixel layout view illustrating a subpixel arrangement configuration and a wire connection state of a stretchable display device according to an exemplary embodiment.

In respective pixel portions Px of a stretchable display device 20 according to the present exemplary embodiment, light emitters 130 are respectively formed in the rigid areas 150 to be selectively emitted depending on a driving signal, and the light emitters 130 may each include subpixels 130R, 130G, and 130B that emit red light (R), green light (G), and blue light (B), respectively. Referring to FIG. 7, the light emitter 130 has a substantially square planar shape, and the red, green, and blue subpixels 130R, 130G, and 130B have a rectangular planar shape with a long longitudinal side, and may be arranged to be adjacent to each other in the first direction (x-axis direction).

Since the red, green, and blue subpixels 130R, 130G, and 130B formed in each pixel portion Px may be separately driven, each of the subpixels 130R, 130G, and 130B may include a thin film transistor. Accordingly, the first wire 210, e.g., the gate wire, is connected to each gate electrode of the subpixels 130R, 130G, and 130B, and the second wire 320 that is the data wire is connected to each source electrode of the subpixels 130R, 130G, and 130B. In this case, the second wires (320: 321, 322, 323) may be respectively connected to the subpixels 130R, 130G, and 130B, wherein the second wires correspond to the number of the subpixels 130R, 130G, and 130B for each pixel portion Px. The first wire 210 and the second wire 320 may be made of an elastic material to be capable of being expanded or contracted themselves.

Figure 8:
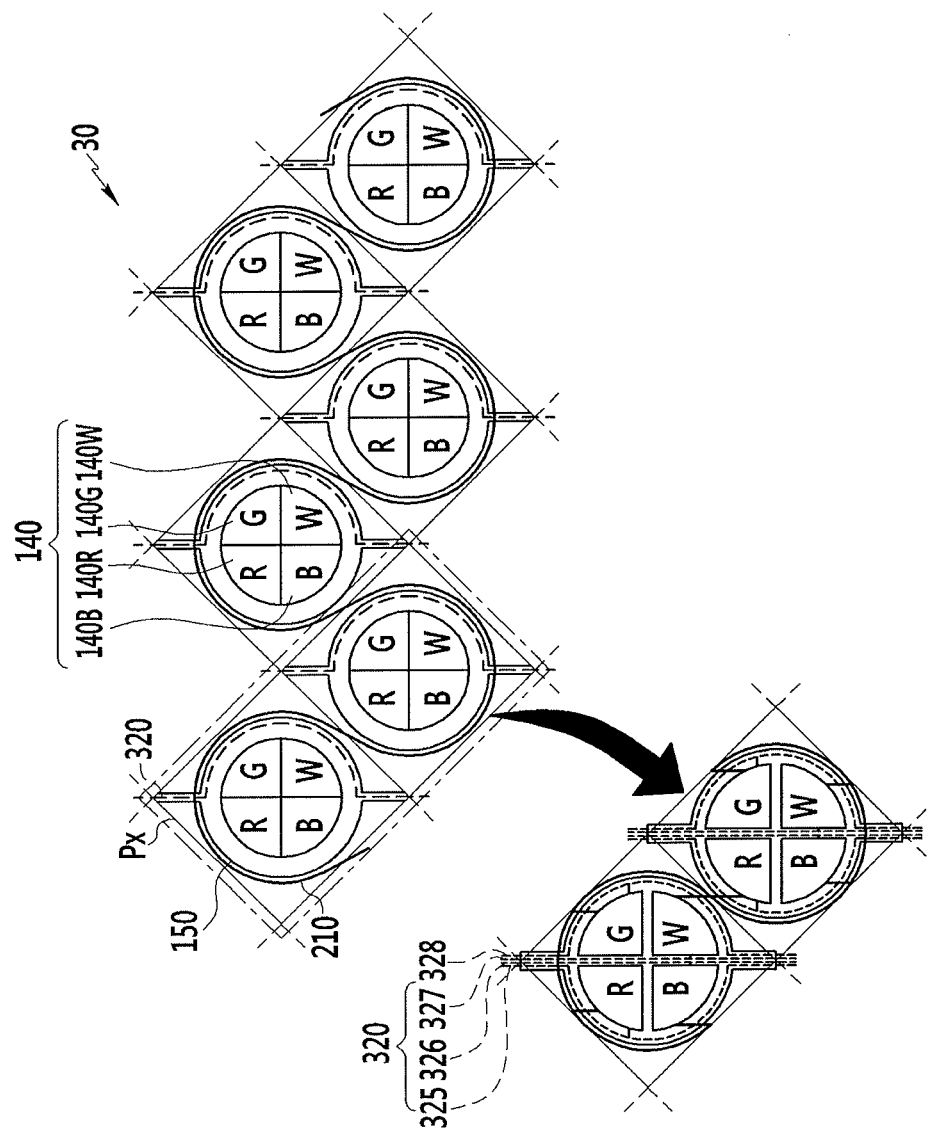
FIG. 8 illustrates a pixel layout view of a subpixel arrangement configuration and a wire connection state of a stretchable display device according to another exemplary embodiment.

FIG. 8 is a pixel layout view illustrating a subpixel arrangement configuration and a wire connection state of a stretchable display device according to another exemplary embodiment.

A light emitter 140 formed in each pixel portion Px of a stretchable display device 30 according to the present exemplary embodiment may include subpixels 140R, 140G, 140B, and 140W that emit red light (R), green light (G), blue light (B), and white light (W), respectively. Referring to FIG. 8, the light emitter 140 has a substantially circular planar shape to be divided into four portions that correspond to the red, green, blue, and white subpixels 140R, 140G, 140B, and 140W, respectively.

Since the red, green, blue, and white subpixels 140R, 140G, 140B, and 140W formed in each pixel portion Px may be separately driven, each of the subpixels 140R, 140G, 140B, and 140W may include a thin film transistor. Accordingly, the first wire 210 that is the gate wire is connected to each gate electrode of the subpixels 140R, 140G, 140B, and 140W, and the second wire 320 that is the data wire is connected to each source electrode of the subpixels 140R, 140G, 140B, and 140W. In this case, the second wire (320: 325, 326, 327, 328) may be respectively connected to the subpixels 140R, 140G, 140B, and 140W, wherein the second wires correspond to the number of the subpixels 140R, 140G, 140B, and 140W for each pixel portion Px.

Figure 9A:
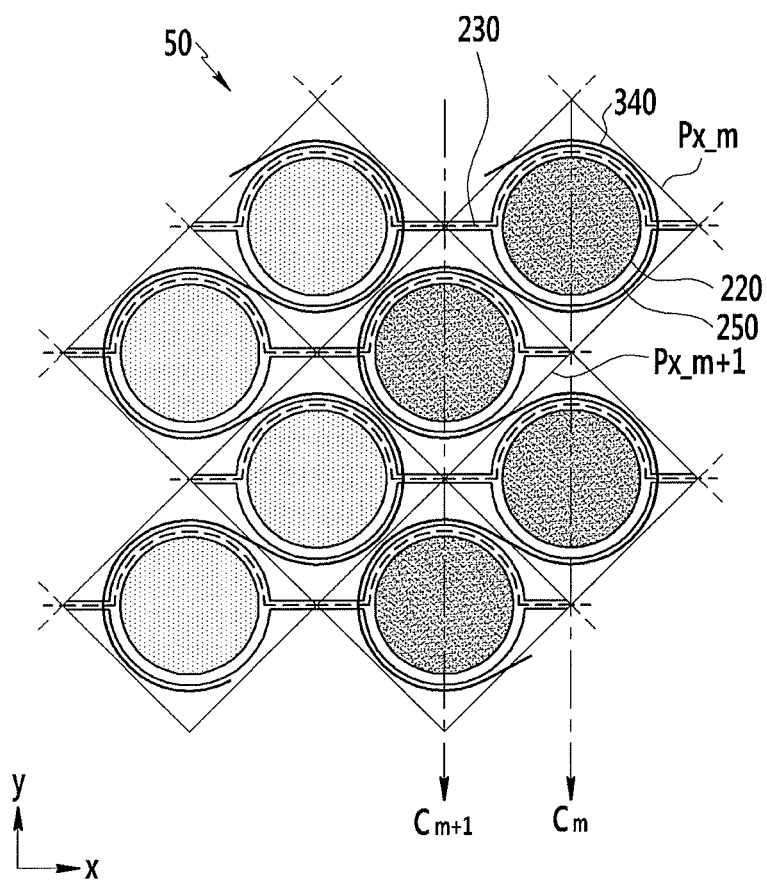
Figure 9B:
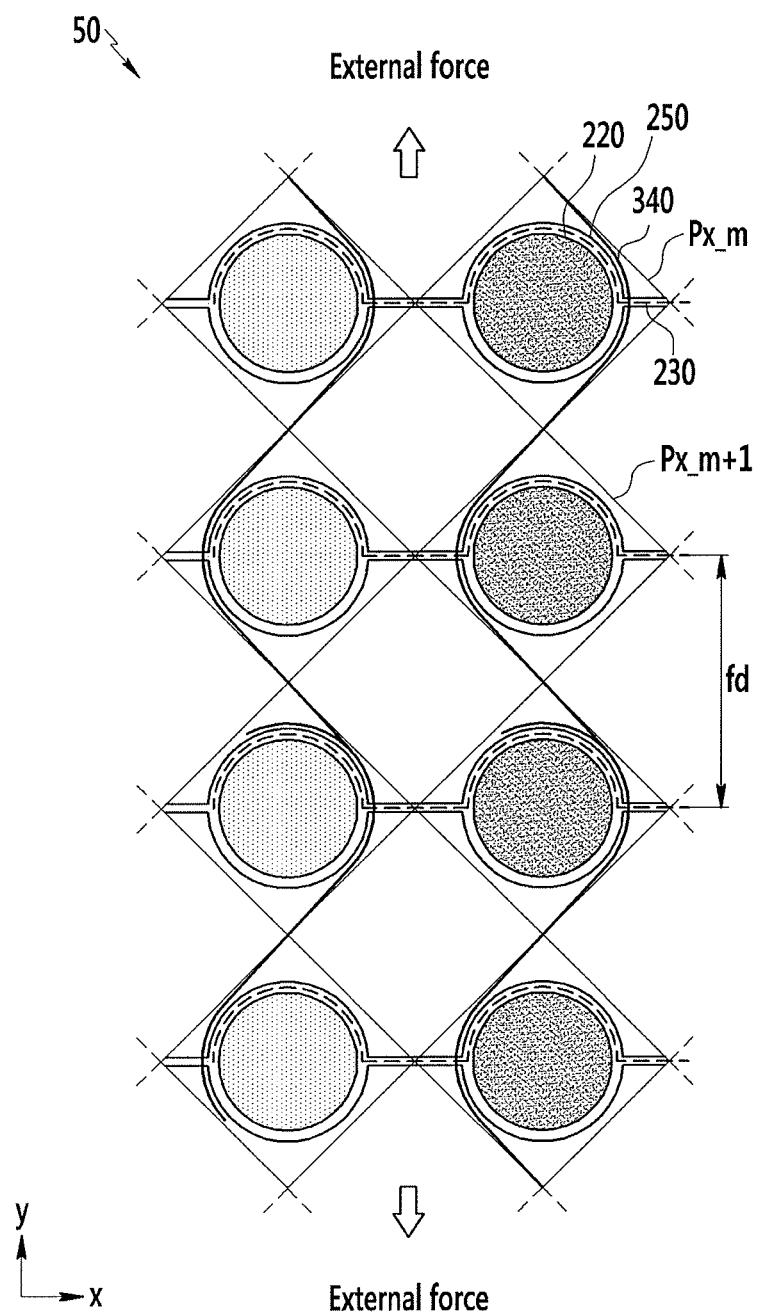

FIGS. 9A and 9B are top plan views of pixel and wire configurations of a stretchable display device according to a further exemplary embodiment. In particular, FIG. 9A illustrates a pixel and wire configuration before the stretchable display device is expanded, and FIG. 9B illustrates a pixel and wire configuration after the stretchable display device is fully expanded.

While the stretchable display device 10 according to the exemplary embodiment shown in FIGS. 5A and 5B is a display device that may be stretched in the first direction (x-axis direction or lateral direction in the drawing), a stretchable display device 50 according to the present exemplary embodiment is a display device that may be stretched in the second direction (y-axis direction or longitudinal direction in FIGS. 9A and 9B). Accordingly, a data wire is formed to be able to stretch.

Referring to FIG. 9A, in the stretchable display device 50 according to the present exemplary embodiment, a plurality of pixel rows are arranged in the first direction (x-axis in FIG. 9A), wherein the pixel column is formed for a plurality of pixel portions Px to be continuously adjacent to each other in the second direction (y-axis direction in FIG. 9A). Further, pixel portions (Px_m) and (Px_m+1) respectively included in an m-th pixel column ($C_m$) and an m+1-th pixel column ($C_{m+1}$) that are adjacent in the first direction are arranged in a zigzag form along the second direction. The first wire 230 extends in the first direction and is around peripheries of light emitter 220 of the pixel portions in a same row, and the second wire 340 is insulated from the first wire 230 and extends in the second direction.

The second wire 340 extends in the second direction and is alternately around a portion of peripheries of the rigid areas 250 of the pixel portions (Px_m) and (Px_m+1), while moving back and forth in the first direction, i.e., between adjacent rows. That is, as shown in FIG. 9A, the second wire 340 extends along the second direction while alternately surrounding a portion of the periphery of the rigid areas 250 of the pixel portion (Px_m) of the m-th pixel column ($C_m$) and of the rigid areas 250 of the pixel portion (Px_m+1) of the m+1-th pixel column ($C_{m+1}$). The first wire 230 extends in the first direction and around peripheries of the rigid areas 250 of the pixel portions in a single row.

The first wire 230 may be a gate wire GL (see FIGS. 2 and 3) connected to the gate electrode of the switching transistor TR1 of each of the pixel portions (Px_m) and (Px_m+1) to transmit a scanning signal. The second wire 340 may be a data wire DL (see FIGS. 2 and 3) connected to the source electrode of the switching transistor TR1 of each of the pixel portions (Px_m) and (Px_m+1) to transmit a data signal.

Referring to FIG. 9B, after the stretchable display device 50 is fully expanded, an interval between the center of the pixel portions (Px_m) included in the m-th pixel column ($C_m$) and the center of the pixel portions (Px_m+1) included in the m+1-th pixel row ($C_{m+1}$) may be shifted in the second direction by the maximum width of the pixel portion (Px_m) or (Px_m+1) in the second direction, and since the pixel portions (Px_m) and (Px_m+1) have a rhomboidal planar shape, the pixel portions (Px_m) and (Px_m+1) are spaced apart from each other by the diagonal length (fd) of the pixel portion, such that the second wire 340 connects pixel portions along a single column.

After the stretchable display device 10 is expanded, the second wire 340 is elongated, like the expanded state of the stretchable substrate 110, in the second direction from a serpentine-shaped state before being elongated. In this case, the second wire 340 may be formed to be elongated along the elongation direction, or may be formed to be folded or unfolded by a serpentine pattern.

Figure 10A:
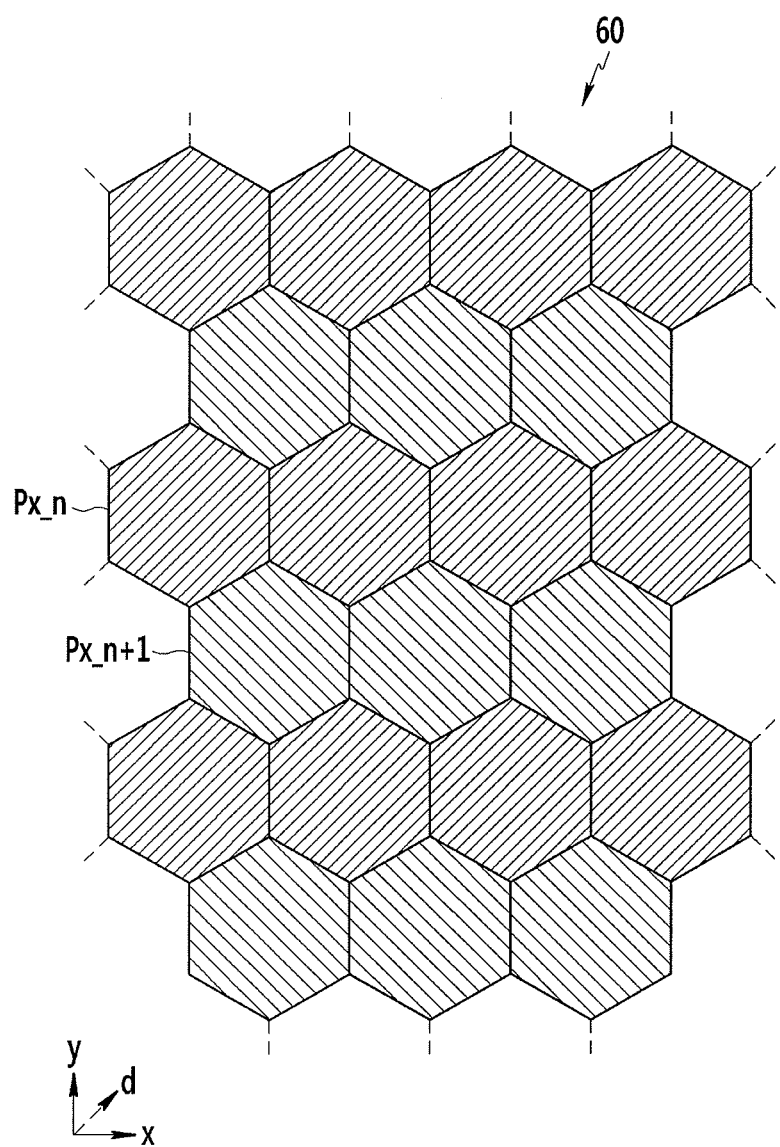
Figure 10B:
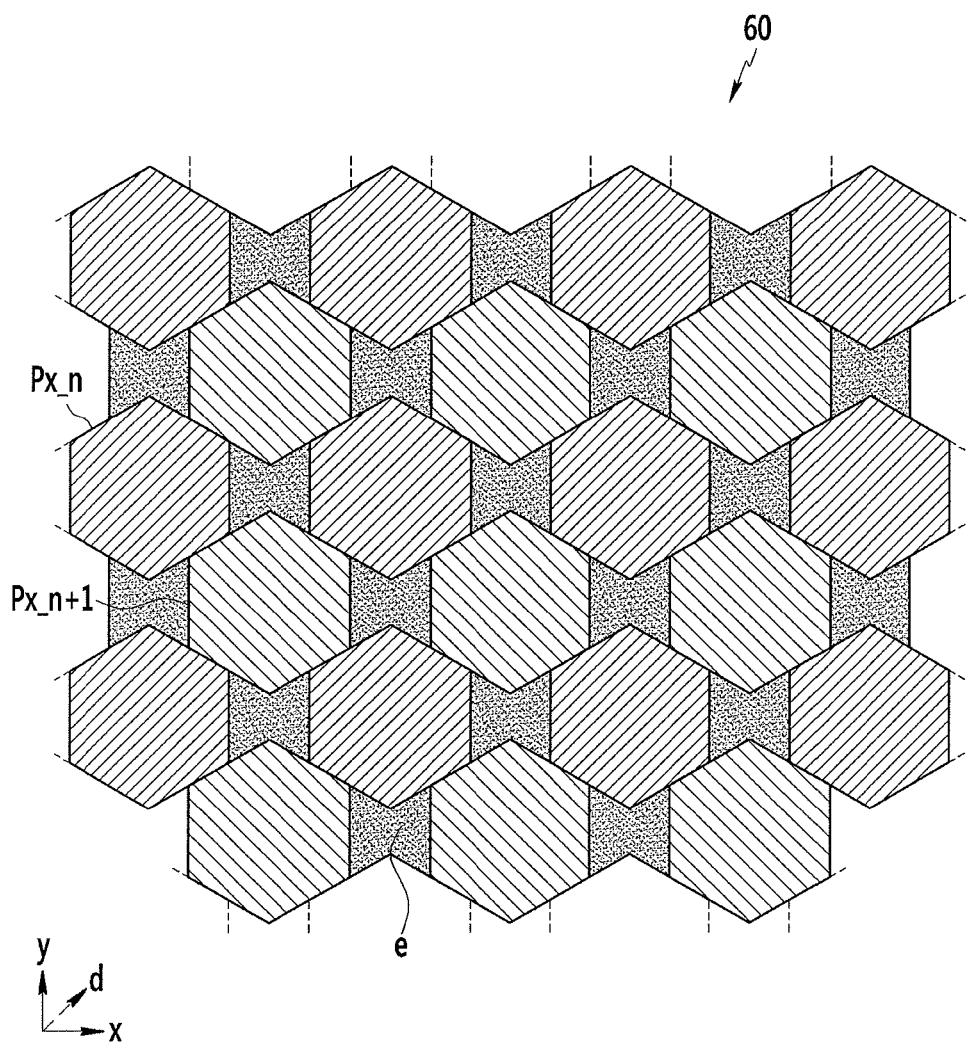
Figure 10C:
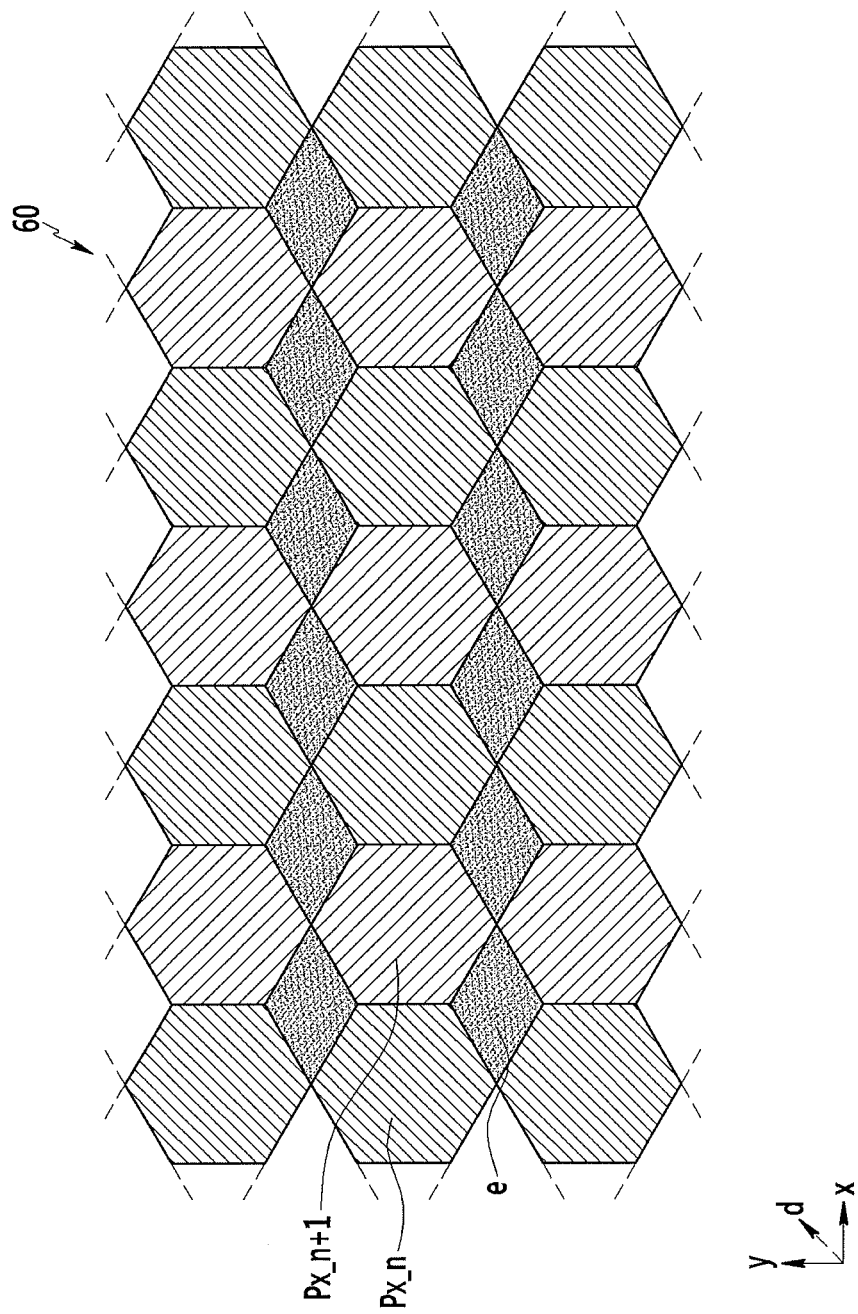

FIGS. 10A to 10C are top plan views of pixel arrangement configurations of a stretchable display device according to another exemplary embodiment. In particular, FIG. 10A illustrates a pixel arrangement configuration before the stretchable display device is expanded, FIG. 10B illustrates a pixel arrangement configuration while the stretchable display device is being expanded, and FIG. 10C illustrates a pixel arrangement configuration after the stretchable display device is fully expanded.

While the pixel portion of the stretchable display device 10 according to the exemplary embodiment shown in FIGS. 4A to 4C has a rhomboidal planar shape, a pixel portion of a stretchable display device 60 according to the present exemplary embodiment is formed to have a hexagonal planar shape.

Referring to FIG. 10A, each of the pixel portions (Px_n) and (Px_n+1) has a hexagonal planar shape in a state before being expanded, the hexagonal pixel portions (Px_n) and (Px_n+1) are arranged to share sides thereof together with the adjacent pixel portions (Px_n) and (Px_n+1) in a diagonal direction (d) of a panel of the display device 60, and the pixel portions (Px_n) and (Px_n+1) are included in respective pixel rows.

Referring to FIG. 10B, when the stretchable display device 60 is expanded to the left and right along the first direction (x-axis direction) by an external force, the elastic areas of the pixel portions (Px_n) and (Px_n+1) are expanded, and arrangement of the pixel portions (Px_n) and (Px_n+1) is changed. That is, an interval between the pixel portions (Px_n) of the n-th pixel row increases in the first direction, and the pixel portions (Px_n+1) of the n+1-th pixel row are respectively moved along the sides of respective pixel portions (Px_n) and (Px_n+1) in a diagonal direction (d) of the panel to be disposed between the pixel portions (Px_n) of the n-th pixel row.

Accordingly, referring to FIG. 10C, when the stretchable display device 60 is laterally expanded to the utmost along the first direction, the pixel portion (Px_n) of the n-th pixel row and the pixel portion (Px_n+1) of the n+1-th pixel row cross along the first direction, and are arranged in a row while sharing their sides. In this case, expansion areas (e) may be formed so that the pixel portions (Px_n) and (Px_n+1) are spaced apart from each other in the diagonal direction (d) of the panel.

As such, by the external force, the stretchable display device 60 is laterally expanded such that the arrangement of the pixel portions are changed, and the pixel portions (Px_n) of the n-th pixel row and the pixel portions (Px_n+1) of the n+1-th pixel row are arranged in a line contacting each other. Thus, an interval between the pixel portions adjacent in a lateral direction (the first direction) may be equally maintained before and after the stretchable display device is expanded. Accordingly, compared with a display device in which an interval between adjacent pixels increases when the display device expands, the stretchable display device according to the present exemplary embodiment may prevent display resolution in an extension direction from deteriorating and improve image representation.

By way of summation and review, embodiments are directed to providing a stretchable display device that may reduce directional deviation of display resolution because pixels are separated in one direction even when the stretchable display device is expanded in one direction. Embodiments have been made in an effort to provide a method of manufacturing a stretchable display device that may reduce directional deviation of display resolution according to a stretching direction. Accordingly, a display device in accordance with embodiments reduces directional deviation of display resolution thereof even when the stretchable display device is expanded in any one direction.

According to the exemplary embodiments, the gate wires or the data wires elongate and are connected to each other while being around portions of peripheries of the pixel portions included in the pixel rows or columns adjacent to each other, such that the pixel portions may be bound together even in a state in which the panel is expanded, and the extent of stretch in orthogonal directions of the panel may be different.

According to the exemplary embodiments, a stretchable pattern may be formed in the serpentine pattern on the substrate, such that the stretchable pattern layer may match movement of the pixel portions, and elongation of the gate wires or the data wires when the stretchable display device is expanded by external force. Accordingly, the pattern of the stretchable pattern layer may have the same cycle as that of arranging of the pixel portions and bending of the gate wire or the data wire.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A stretchable display device, comprising:
    a stretchable substrate to be expanded or contracted along a first direction; and
    pixel portions on the stretchable substrate, each pixel portion including a rigid area, a light emitter to selectively emit light depending on a driving signal on the rigid area, and an elastic area surrounding the rigid area and being stretchable in the first direction, wherein
    a plurality of the pixel portions are continuously adjacent to each other in the first direction to form a plurality of pixel lines, and
    the pixel portions included in a first pixel line and a second pixel line that are adjacent in a second direction crossing the first direction, are arranged in a zigzag form along the first direction in an initial state.

2. The stretchable display device as claimed in claim 1, wherein the first pixel line is an n-th pixel row and the second pixel line is an n+1-th pixel row.

3. The stretchable display device as claimed in claim 2, wherein an interval between the center of the pixel portions of the n-th pixel row and the center of the pixel portions of the n+1-th pixel row in the first direction is half of that between the centers of adjacent pixel portions of the n-th pixel row in the first direction.

4. The stretchable display device as claimed in claim 2, wherein the pixel portions in the n+1-th pixel row are disposed to be moved by a half interval of a maximum width of the n+1-th pixel portion in the first direction from respective pixel portions included in the n-th pixel row in the first direction.

5. The stretchable display device as claimed in claim 1, wherein the stretchable substrate includes a stretchable pattern layer having a serpentine pattern.

6. The stretchable display device as claimed in claim 5, wherein the serpentine pattern extends in the first direction while moving back and forth in the second direction.

7. The stretchable display device as claimed in claim 1, wherein an area of the stretchable substrate corresponding to the elastic area of the pixel portion is made of an elastic material.

8. The stretchable display device as claimed in claim 1, wherein the stretchable substrate is made of a polydimethylsiloxane (PDMS) material.

9. The stretchable display device as claimed in claim 1, further comprising a first wire that extends in the first direction while being around boundaries of the rigid areas of the pixel portions.

10. The stretchable display device as claimed in claim 9, wherein the first wire alternately winds along the rigid areas of the pixel portions of the first pixel line and the rigid areas of the pixel portions of the second pixel line.

11. The stretchable display device as claimed in claim 1, further comprising a second wire that extends in the second direction while being around along boundaries of the rigid areas of the pixel portions.

12. The stretchable display device as claimed in claim 1, wherein the rigid area of each pixel portion has a circular planar shape.

13. The stretchable display device as claimed in claim 1, wherein the rigid area is made of a rigid material.

14. The stretchable display device as claimed in claim 1, wherein the elastic area is made of an elastic material.

15. The stretchable display device as claimed in claim 1, wherein:
    the pixel portion includes a thin film transistor in the rigid area,
    a first wire that extends in the first direction and is connected to a gate electrode of the thin film transistor, and
    a second wire that extends in the second direction and is connected to a source electrode of the thin film transistor.

16. The stretchable display device as claimed in claim 1, wherein the pixel portion has a rhomboidal planar shape.

17. The stretchable display device as claimed in claim 16, wherein:
    the first pixel line is an n-th pixel row,
    the second pixel line is an n+1-th pixel row, and
    the pixel portions included in the n+1-th pixel row are respectively disposed to be moved by half of a diagonal length of the n+1-th pixel portion in the first direction from respective pixel portions included in the n-th pixel row.

18. The stretchable display device as claimed in claim 1, wherein the pixel portion has a hexagonal planar shape.

19. The stretchable display device as claimed in claim 1, wherein the pixel portion includes light emitters that respectively emit red, green, and blue light.

20. The stretchable display device as claimed in claim 18, wherein respective subpixels have a rectangular planar shape and are adjacent to each other in the first direction.

21. The stretchable display device as claimed in claim 1, wherein the subpixel includes light emitters that respectively emit red, green, blue, and white light.

22. The stretchable display device as claimed in claim 21, wherein the subpixel divides the light emitter in four portions.

23. The stretchable display device as claimed in claim 1, wherein the first pixel line is an m-th pixel column and the second pixel line is an m+1-th pixel column.

* * * * *